United States Patent [19]

Cabler

[11] Patent Number: 5,625,357
[45] Date of Patent: Apr. 29, 1997

[54] CURRENT STEERING SEMI-DIGITAL RECONSTRUCTION FILTER

[75] Inventor: Carlin D. Cabler, Austin, Tex.

[73] Assignee: Advanced Micro Devices, Inc., Sunnyvale, Calif.

[21] Appl. No.: 389,362

[22] Filed: Feb. 16, 1995

[51] Int. Cl.$^6$ .................................................. H03M 1/66
[52] U.S. Cl. ........................... 341/143; 341/144; 377/42
[58] Field of Search .................................. 341/143, 152, 341/144; 377/42, 48, 76

[56] References Cited

U.S. PATENT DOCUMENTS

| | | | |
|---|---|---|---|
| 3,500,215 | 3/1970 | Leuthold et al. | 341/143 |
| 3,521,170 | 7/1970 | Leuthold et al. | 341/143 |
| 3,543,009 | 11/1970 | Voelcker, Jr. | 341/153 |
| 3,793,589 | 2/1974 | Puckette | 341/147 |
| 4,633,610 | 1/1987 | Meltz et al. | 341/144 |
| 4,816,830 | 3/1989 | Cooper | 341/144 |
| 4,947,171 | 8/1990 | Pfeifer et al. | 341/143 |
| 5,043,730 | 8/1991 | Obinata | 341/144 |
| 5,196,850 | 3/1993 | Duffy et al. | 341/76 |
| 5,212,659 | 5/1993 | Scott et al. | 364/724.1 |
| 5,245,344 | 9/1993 | Sooch | 341/150 |
| 5,298,900 | 3/1994 | Mauthe et al. | 341/143 |
| 5,323,157 | 6/1994 | Ledzius et al. | 341/143 |
| 5,376,936 | 12/1994 | Kerth et al. | 341/150 |

OTHER PUBLICATIONS

David K. Su, et al., "A CMOS Oversampling D/A Converter with a Current–Mode Semidigital Reconstruction Filter," *IEEE Journal of Solid–State Circuits*, vol. 28, No. 12, Dec. 1993, pp. 1224–1233.

"An Integrated Per–Channel PCM Encoder on Interpolation," Bruce A. Wooley, et al., *IEEE Transactions on Communications*, vol. COM–27, No. 2, Feb. 1979, pp. 272–277.

"Multirate Filter Designs Using Comb Filters," Shuni Chu, et al., *IEEE Transactions on Ciruits and Systems*, vol. CAS–31, No. 11, Nov. 1984, pp. 913–924.

"An Economical Class of Digital Filters for Decimation and Interpolation," Eugene B. Hogenauer, *IEEE Transactions on Acoustics, Speech, and Signal Processing*, vol. ASSP–29, No. 2, Apr. 1981, pp. 155–162.

"Multirate Digital Filters, Filter Banks, Polyphase Networks, and Applications: A Tutorial," P. O. Vaidyanathan, *Proceedings of the IEEE*, vol. 78, NO. 1, Jan. 1990, pp. 56–93.

"A Multistage Delta–Sigma Modulator without Double Integration Loop," Toshio Hayashi, et al., *1986 IEEE International Solid–State Circuits Conference*, ISSCC 86/Thursday, /Feb., 29 1986. California Pavilion C, THPM 14.6, pp. 182–183.

"A 3-$\mu$n CMOS Digital Codec with Programmable Echo Cancellation and Gain Setting," Paul Defraeye, et al., *IEEE Journal of Solid–State Circuits*, vol. SC–20, No. 3, Jun. 1985, pp. 679–687.

(List continued on next page.)

*Primary Examiner*—Howard L. Williams
*Attorney, Agent, or Firm*—Fulbright & Jaworski L.L.P.

[57] ABSTRACT

A current steering semi-digital reconstruction filter for a digital-to-analog conversion circuit, which includes a shift register having a 1-bit digital input stream and a plurality of output taps, where each output tap provides a 1-bit signal which has a value of a logic 1 or a logic 0, and a plurality of resistive paths, where each resistive path includes a resistive element which is connected to a common current source and to a first terminal of an active high switch and a first terminal of an active low switch. A single output tap is used to control the active high switch and the active low switch for a single resistive path. A second terminal of each active high switch of each of the plurality of resistive paths is connected to a non-inverted current path, and a second terminal of each active low switch for each of the plurality of resistive paths is connected to an inverted current path.

21 Claims, 4 Drawing Sheets

OTHER PUBLICATIONS

"A 17–bit Oversampling D–to–A Conversion Technology Using Multistage Noise Shaping," Yasuyki Matsuya, et al., *IEEE Journal of Solid–State Circuits*, vol. 24, No. 4, Aug. 1989, pp. 969–975.

"Fourth Order Sigma–Delta Modulator Circuit For Digital Audio And ISDN Applications,"T. Karema, et al., Tampere University of Technology, Finland, pp. 223–227.

"Area–Efficient Multichannel Oversampled PCM Voice–Band Coder," Bosco H. Leung, et al., *IEEE Journal of Solid–State Circuits*, vol. 23, No. 6, Dec. 1988, pp. 1351–1357.

"Reduction of Quantizing Noise by Use of Feedback*," H. A. Spang, III, and P. M. Schultheiss, reprinted from *IRE Trans. Commun. Systems*, pp. 373–380, Dec. 1962.

"Design of Stable High Order 1–Bit Sigma–Delta Modulators," Tapani Ritoniemi, et al., Signal Processing Laboratory, Tampere University of Technology, reprinted from *IEEE Proc. ISCAS'90*, pp. 3267–3270, May 1990.

"A Higher Order Topology for Interpolative Modulators for Oversampling A/D Converters," Kirk C.–H. Chao, et al., reprinted from *IEEE Trans. Circuits and Sys.*, vol. CAS–37, pp. 309–318, Mar. 1990.

"A Stereo 16–Bit Delta–Sigma A/D Converter for Digital Audio*," D. R. Welland, et al., reprinter with permission from *Journal of the Audio Engineering Society*, vol. 37, pp. 476–486, Jun. 1989.

"A Monolithic 50KHz 16–Bit A/D–D/A Converter Using Sigma–Delta Modulation," Charles D. Thompson, et al., Digital Signal Processor Operation/Motorola, Inc. 1990 *IEEE*.

"A CMOS Oversampling D/A Converter with a Current–Mode Semi–Digital Reconstruction Filter," D. Su and B. Wooley, *1993 ISSCC*, vol. 36, pp. 230–231.

"Design and Implementation of Digital FIR Filters," P. P. Vaidyanathan, Chapter 2 in *Hnadbook of DSP Engineering Applications*, D. F. Elliott, editor, Academic Press, 1987.

"Oversampling A/D & D/A Conversion," B. A. Wooley, Presentation to AMD at Standard University, Sep. 14, 1992.

"Finite Impulse Response Switched–Capacitor Filters for the Delta–Sigma Modulator D/A Interface," P. J. Hurst and James E. C. Brown, *IEEE Trans. Circuits Sys.*, vol. 38, No. 11, pp. 1391–1397, Nov. 1991.

"Analog FIR Filters with an Oversampled $\Sigma$–$\Delta$ Modulator, "H. Qiuting and G. Moschytz, *IEEE Trans. Circuits Syst.*, vol. 39, No. 9, pp. 658–663, Sep. 1992.

CURRENT STEERING SEMI-DIGITAL RECONSTRUCTION FILTER

SPECIFICATION

BACKGROUND OF THE INVENTION

1. Field of the Invention

The present invention relates to a digital-to-analog filter. More specifically, the present invention relates to a digital-to-analog filter which uses current steering techniques.

2. Brief Description of the Related Technology

Previous methods for digital-to-analog (D/A) conversion and reconstruction filtering involve several methods. The actual D/A conversion process has been accomplished using methods such as a single current source and sink, or by dumping charge from a switched capacitor that has been charged to either a positive or negative reference voltage. Reconstruction filtering has been accomplished by using a combination of active and/or passive classical filtering techniques, such as continuous time active filters with resistors and capacitors, continuous time passive filters utilizing resistors, capacitors, and inductors, or switched capacitor filter techniques. A method of filtering which combines a D/A converter with a reconstruction filter has recently become known in the art.

Oversampled D/A converters generally include the following signal processing blocks: (1) an interpolator filter, or series of filters, which raises the sample rate of the incoming digital signal to a higher sample rate, (2) a digital sigma-delta processor (or noise shaper) which lowers the number of bits representing the signal by shaping the quantization noise in a way that places most of it at higher frequencies, (3) a D/A converter which converts the output of the noise shaper into an analog signal, and (4) an analog low pass filter which removes, or substantially lowers, the noise that was placed at higher frequencies by the noise shaper.

As illustrated in FIG. 1, a semi-digital reconstruction filter typically uses a tapped delay line, or shift register, to control a plurality of devices each of which has an associated gain factor. The outputs of the plurality of devices are then summed together to form a single output of the filter. In some cases, individual current sources are employed as the plurality of devices. The amount of current in each current source is designed such that a desired FIR filter response is achieved. The output of each current source is then provided, or steered, to a current summing node (IOUT) or to an alternative current summing node (IOUT*), depending on the logic state of the control bit ($B_N$) at the delay line tap associated with each current source. The currents at one or both of the current summing nodes are then converted to a voltage using standard current to voltage conversion techniques. Additional filtering may then be employed to remove extremely high frequency noise.

In other cases, the plurality of devices in the semi-digital filter FIR coefficients are represented as charge stored on a plurality of capacitors. The charge on each capacitor can then be summed by employing a switched capacitor summing amplifier. Once again, additional filtering may be employed to remove any extremely high frequency noise.

In another semi-digital filter scheme, the FIR coefficients are represented as a current value through a plurality of resistors. Each resistor is selectively connected to a voltage reference depending on the state of the individual control bit from the delay line tap associated with each individual resistor. The current is then summed and converted to a voltage by means of resistive feedback around an operational amplifier (op amp). As in the previous methods discussed, additional filtering may be employed to remove any high frequency noise.

In all sigma-delta D/A converters, there exists a need to filter the high frequency noise inherent to this method of conversion. It is common for a digital noise shaper (digital sigma-delta modulator) to have as its output a single bit. The single bit digital output signal is then converted to an analog signal using switched capacitor techniques or switched current source techniques. Once this conversion is made, filtering of the high frequency noise is then accomplished through a variety of means.

SUMMARY OF THE INVENTION

The method and apparatus described herein is one which uses a single current reference and a current divider network which includes a plurality of parallel resistive paths. The amount of current through each resistive path is dependent on the effective resistance in each resistive path. The current through each resistive path is steered to a current summing node, or an alternative current summing node, depending on the logic level of a control bit at a delay line tap associated with each resistive path. A shift register which shifts the single bit, output signal from a digital sigma-delta modulator, forms a delay line. The shift register includes a series of flip-flops.

The output of each flip flop provides the input of the next flip flop in the series. All flip-flops are clocked at the same rate. The output of each flip flop also provides the control bit associated with each resistive path. That is, for an individual resistive path, if the control bit is a logic 1, the current through the resistive path is steered to the current summing node. If the control bit is a logic 0, the current is steered to the alternative current summing node. Since a tapped delay line and a summed output(s) consisting of weighted values (with weight determined by resistance value of each resistive path) of the intermediate points in the tapped delay line are provided, a Finite Impulse Response (FIR) filter exists. Such a filter may be designed using techniques available to those smiled in the art. Any type of filter such as bandpass, bandreject, high pass, and low pass may be built using this technique. The present invention is directed to, a low pass filter which is desirable to remove high frequency noise generated by the sigma-delta process.

DETAILED DESCRIPTION OF THE PREFERRED EMBODIMENT

The present invention utilizes a single reference current, IREF, a resistive current division network, a method for steering the output of each individual resistor in the current steering network, a current summing node, an alternative current summing node, and a method to convert the current in the current summing node to a voltage.

Figure 1:
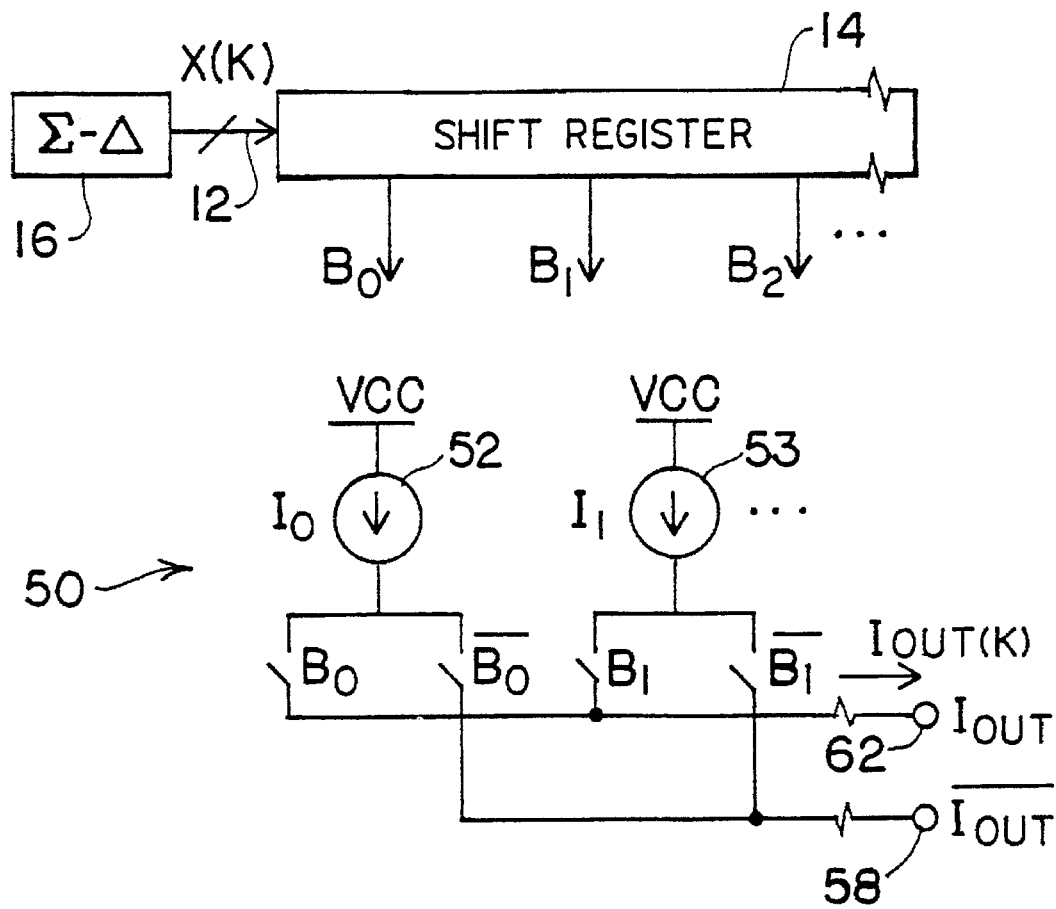
FIG. 1 schematically illustrates a prior art embodiment of a semi-digital FIR filter utilizing a plurality of current sources.

FIG. 1 illustrates a prior art implementation of a semi-digital FIR filter 50 using a plurality of current sources 52 and 53. The 1-bit output from a sigma-delta modulator 16 is input to shift register 14 as input signal 12. The current flows through the non-inverted current switches (B0, B1) to non-inverted current summing node 62 and through inverter current switches (B0*, B1*) to inverted current summing node 58. Switches B0 and B0* are controlled by the logic level of output tap B0 of shift register 14. Switches B1 and B1* are controlled by the logic level of output tap B1. If output tap B0 is a logic 0, inverted current switch B0* is closed and non-inverted switch B0 is open, causing current to flow from current source 52 to inverted current summing node 58. If output tap B0 is a logic 1, non-inverted current switch B0 is closed and inverted current switch B0* is open, causing current to flow from current source 52 to non-inverted current summing node 62. Non-inverted current switch B1 and inverted current switch B1* would function in a similar manner, causing current to flow from current source 53 to non-inverted current summing node 62 or inverted current summing node 58, depending on the logic value of shift register output tap B1.

Figure 2:
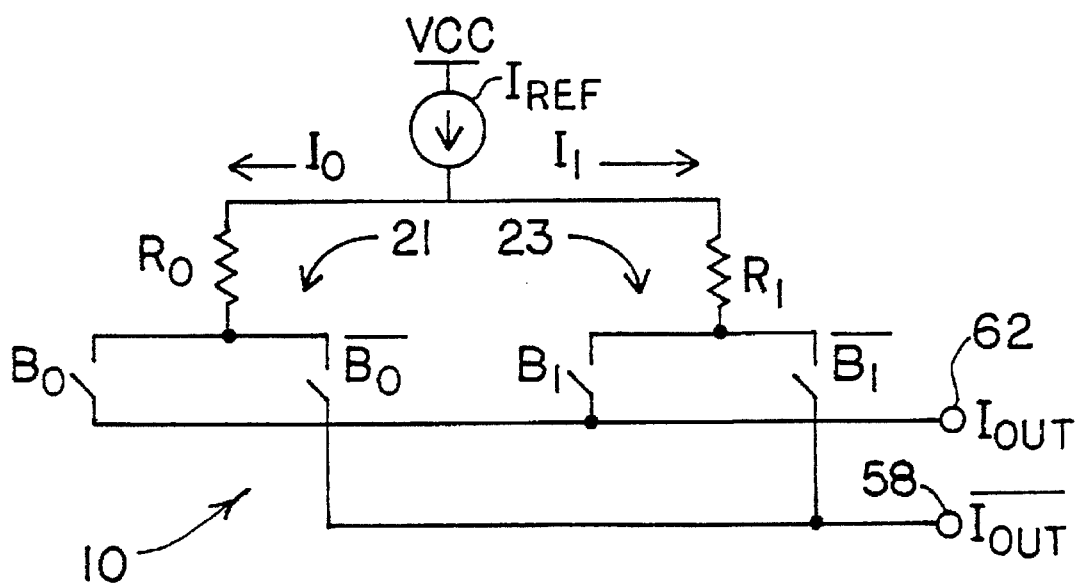
FIG. 2 schematically illustrates a semi-digital FIR filter which uses a single current source and current steering techniques of present invention.

FIG. 2 illustrates a semi-digital FIR filter current steering circuit 10 of the present invention. FIG. 2 depicts a current steering circuit 10 which includes two control bits (B0 and B1) and their logical inverses (B0* and B1*) which are output from shift register 14 as output tap B0 and B1, respectively. These control bits are used to control whether the current in an individual resistive path 21, 23 is steered to non-inverted current summing node 62 (IOUT), or to the alternative current summing node, inverted current summing node 58 (IOUT*). In order for the individual currents through the resistive paths 21, 23 to remain constant, the current summing nodes 62, 58 (IOUT and IOUT*) must be held at identical voltages. For the example shown in FIG. 2, it will be assumed that summing nodes 62 and 58 (IOUT and IOUT*) are at zero volts. Thus, the current through resistive path 21, represented by resistive element R0, is represented by the following equation:

$$I0 = IREF[R1/(R0+R1)]$$

Likewise, the current through resistive path 23, represented by resistive element R1, is given by the following equation:

$$I1 = IREF[R0/(R0+R1)]$$

Therefore, the current in non-inverted current summing node 62 (IOUT) can be represented by the following equation:

$$IOUT(k) = I0 \times [x(k)] + I1 \times [x(k-1)]$$

where x(k) is the digital input signal 12, illustrated in FIG. 1, where input signal 12 (x(k)) is output from sigma-delta modulator 16, and where IOUT(k) represents the output current in the non-inverted current summing node 62, and I0 and I1 are the currents through the two resistive paths 21, 23, for R0 and R1, respectively.

The standard equation for an FIR filter is given by:

$$y(k) = a_0[x(k)] + a_1[x(k-1)] + \ldots a_n[x(k-n)]$$

Since the equation for non-inverted current IOUT(k) is of the same form as for y(k), the structure illustrated in FIG. 1 is an FIR filter. The equation for non-inverted current IOUT(k) can also be written in the following way by substituting I0 and I1 as their equivalent functions of current source IREF, resistive elements R0 and R1, as given in the above equations by:

$$IOUT(k) = [IREF[R1/(R0+R1)]] \times (k) + [IREF[R0/(R0+R1)]] \times (k-1)$$

Table 1 provides the summed currents IOUT and IOUT* for all possibilities of switches B0 and B1 in FIG. 2.

TABLE 1

| B0 | B1 | IOUT | IOUT* |
|---|---|---|---|
| 0 | 0 | 0 | IREF |
| 0 | 1 | $\dfrac{R0\,IREF}{R0+R1}$ | $\dfrac{R1\,IREF}{R0+R1}$ |
| 1 | 0 | $\dfrac{R1\,IREF}{R0+R1}$ | $\dfrac{R0\,IREF}{R0+R1}$ |
| 1 | 1 | IREF | 0 |

Figure 3:
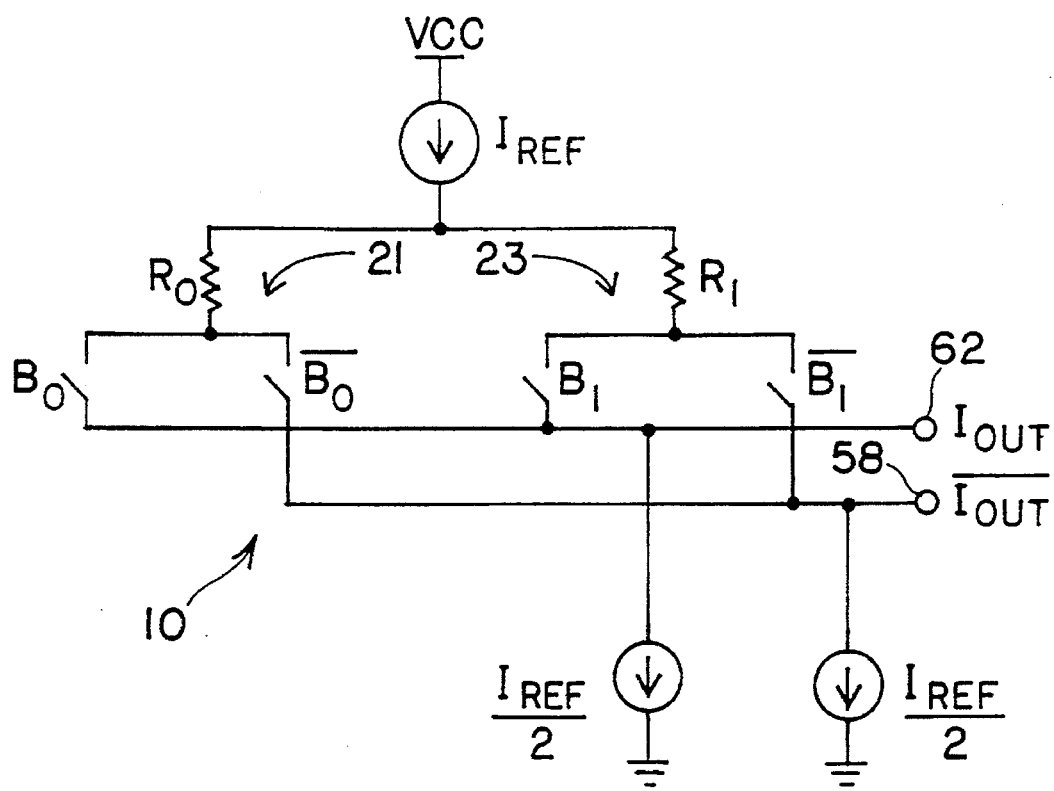
FIG. 3 schematically illustrates an embodiment of the present invention which removes an effective DC offset using a current source.

Since, in FIG. 1, input signal 12 (x(k)) can take on only a value of logic 0 or logic 1, current summing nodes IOUT and IOUT* can only be equal to zero or positive values. In fact, both current summing nodes IOUT and IOUT* may take on values from zero to the value of current source IREF (FIG. 2). Thus, the structure illustrated in FIG. 2 adds an effective DC offset with a value of IREF/2. This can easily be removed by subtracting a fixed amount of current, IREF/2, from current summing nodes IOUT and IOUT*, as shown in FIG. 3. Table 2 illustrates that both current summing nodes, IOUT and IOUT*, may take on values from −IREF/2 to IREF/2.

TABLE 2

| B0 | B1 | IOUT | IOUT* |
|---|---|---|---|
| 0 | 0 | $-\dfrac{IREF}{2}$ | $\dfrac{IREF}{2}$ |
| 0 | 1 | $\dfrac{R0\,IREF}{R0+R1} - \dfrac{IREF}{2}$ | $\dfrac{R1\,IREF}{R0+R1} - \dfrac{IREF}{2}$ |
| 1 | 0 | $\dfrac{R1\,IREF}{R0+R1} - \dfrac{IREF}{2}$ | $\dfrac{R0\,IREF}{R0+R1} - \dfrac{IREF}{2}$ |
| 1 | 1 | $\dfrac{IREF}{2}$ | $-\dfrac{IREF}{2}$ |

In fact for each combination of switches B0 and B1, the value of inverted current summing node 58, IOUT*, is equal to negative the value of non-inverted current summing node 62, −[IOUT]. Thus, the inverted and non-inverted currents are differential in nature. This differential current embodiment is used to remove any even-ordered distortion which may occur.

Figure 4:
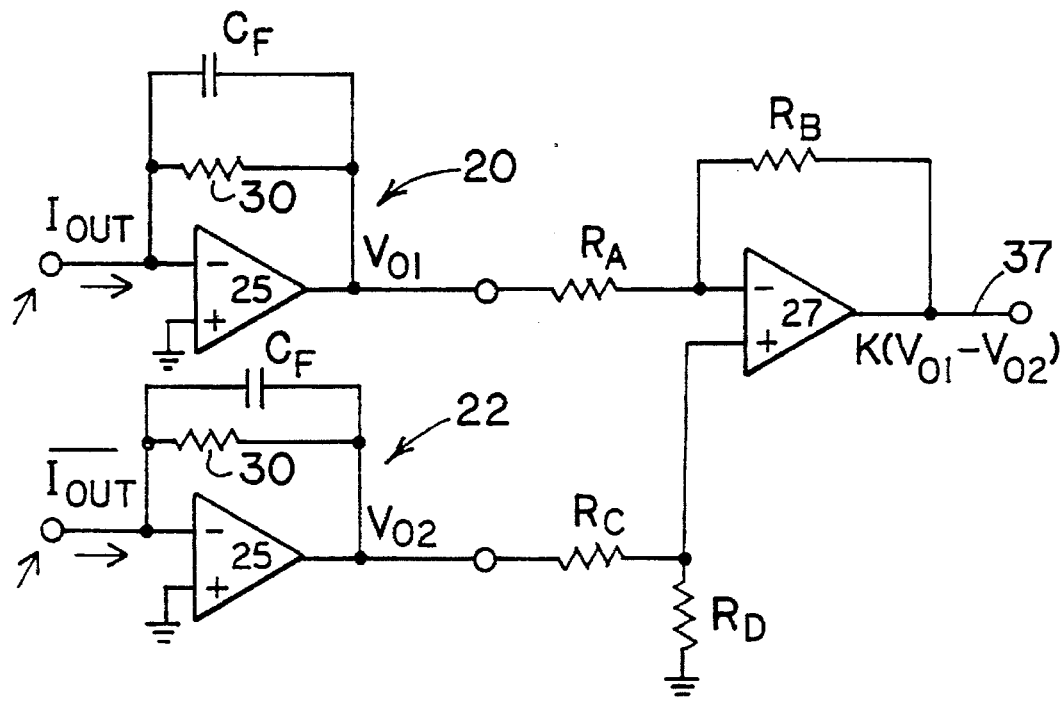
FIG. 4 schematically illustrates an embodiment of the present invention which utilizes differential currents and differential voltages.

FIG. 4 illustrates a method of converting current summing nodes IOUT and IOUT* from differential currents to differential voltages via operational amplifier circuits 20 and 22. Each op amp circuit, 20 and 22, includes an op amp 25 and a feedback resistor 30. If desired, the differential voltages in this embodiment may be converted to a single-ended voltage 37 using series input resistor $R_A$, voltage divider resistor network $R_C$ and $R_D$ and feedback resistor $R_B$ together with op amp 27, as shown in FIG. 4. As stated previously, additional filtering of extremely high frequency noise can then be accomplished by connecting a capacitor $C_F$ in parallel to feedback resistor 30 in FIG. 4.

Figure 5A:
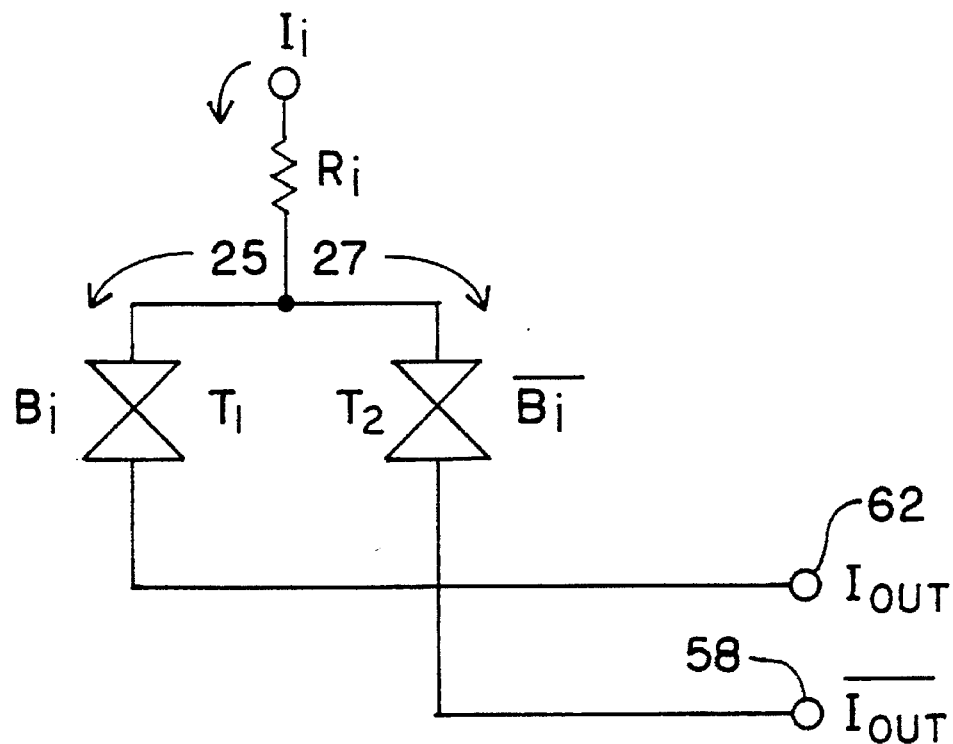
FIGS. 5a–c schematically illustrate various embodiments to implement the resistive paths or R0 and R1 associated with the switches of FIGS. 2 and 3.

Several techniques may be used to implement the resistive paths 21 and 23, via resistive elements R0 and R1 and associated switches B0, B0*, B1, and B1* of FIGS. 2 and 3. Resistive elements R0 and R1 may be resistors, as shown in FIGS. 2 and 3. As shown in FIG. 5a, an explicit resistor $R_i$ and a pair of switches $B_i$ and $B_i$* are utilized to implement resistive paths 25 and 27. The resistor $R_i$ may be realized as a poly resistor, a diffused resistor, a thin film resistor, or by any of the standard methods of realizing resistors. The switches $B_i$ and $B_i$* may be realized by employing CMOS transmission gates $T_1$ and $T_2$, or single MOSFETS, to act as switches. In the technique of FIG. 5a, the resistance of an individual resistive path 25 or 27 would be the sum of the explicit resistor, $R_i$, plus the effective "on" resistance of the switch $B_i$ or $B_i$*. Care must be taken to make the "on" resistance of $T_1$ and $T_2$ negligible with respect to $R_i$, or, alternatively, the "on" resistance of the switch $B_i$ or $B_i$* may also be ratioed by the same ratio which is used to calculate $R_i$. However, like the prior art techniques shown in FIG. 1, discussed above, any error in effective static switch "on" resistance will only change the effective FIR coefficient for the filter and will not affect the linearity of the filter.

Figure 5B:
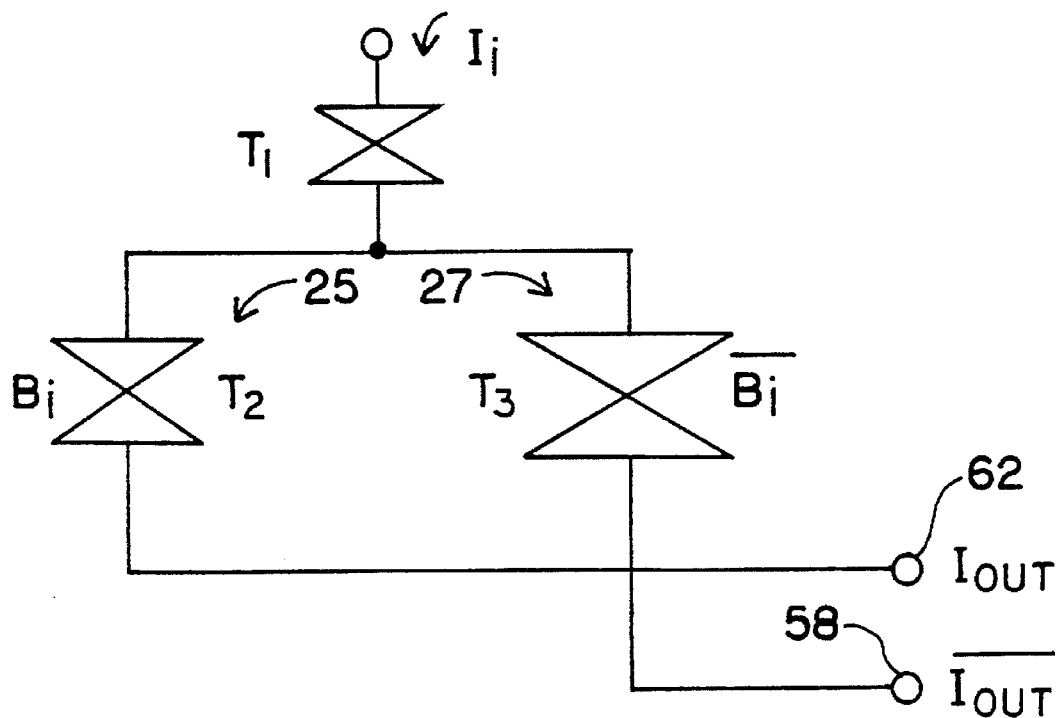

Another technique that may be used to implement resistive paths 25 and 27 is shown in FIG. 5b, is to realize R0 or R1 in FIGS. 2 and 3 as the effective "on" resistance of a CMOS transmission gate $T_1$, or single MOSFET transistor. In FIG. 5b, $T_1$ represents the effective resistance for R0 or R1. The switches $B_i$ and $B_i$* are likewise realized as CMOS transmission gates $T_2$ and $T_3$, or as single MOSFET transistors. The switches $B_i$ and $B_i$* are designed such that the effective "on" resistance of gate $T_2$ is identical to the effective "on" resistance of gate $T_3$. Thus, the effective resistance of the resistive paths 25 or 27 is the sum of the "on" resistance of gate $T_1$ plus the "on" resistance of gate $T_2$ or $T_3$. Like the technique described above for FIG. 5a, the "on" resistance of gate $T_2$ and $T_3$ must either be made negligible with respect to the "on" resistance of gate $T_1$, or they must be ratioed by the same ratio which is used to calculate the on resistance of gate $T_1$. Once again, any error in effective static switch "on" resistance will only change the effective FIR filter coefficient and will not affect the linearity of the analog signal at current summing nodes 62 and 58, IOUT and IOUT*.

Figure 5C:
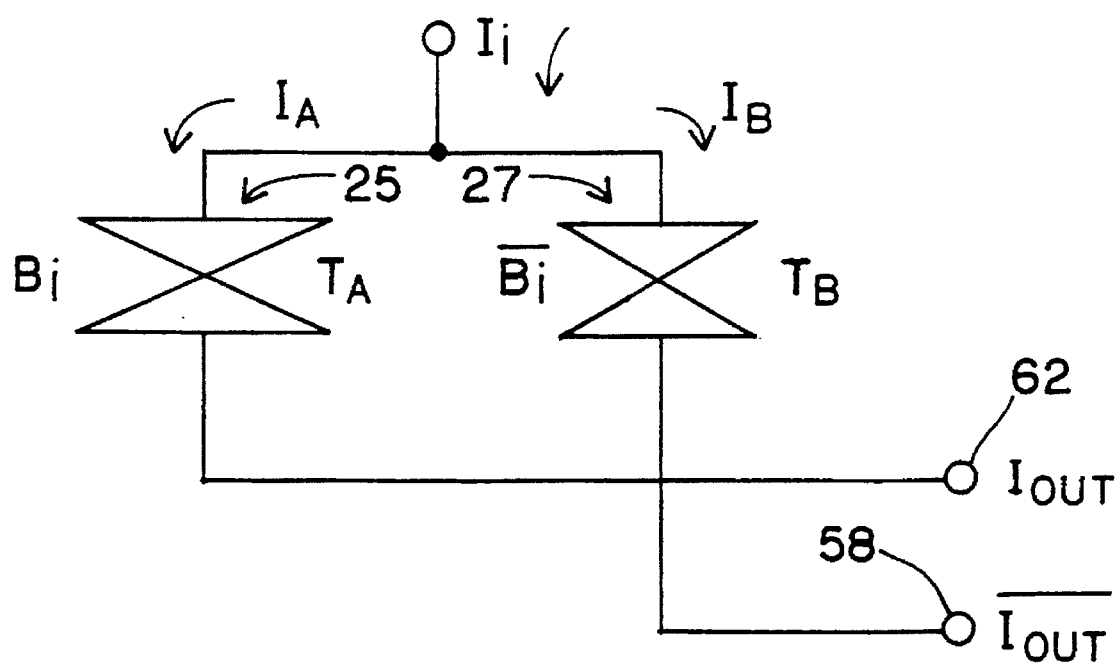

An alternative technique that may be used to implement resistive paths 25 and 27, shown in FIG. 5c. Resistive elements R0 and R1 and switches B0, B0*, B1, and Bi* are implemented as individual CMOS transmission gates $T_A$ and $T_B$, or as single MOSFET transistors. In this case, the "on" resistance of gate $T_A$ is designed to be equivalent to the "on" resistance of gate $T_B$. Thus, the effective resistance of the resistive paths 25 or 27 is the "on" resistance of gates $T_A$ or $T_B$. Like the above methods shown in FIGS. 5a or 5b, any error in effective static "on" resistance will only change the effective FIR filter coefficient (and therefore the frequency response of the filter) and not the linearity of the analog signal which results from using this technique.

The prime reason the current steering structure of the present invention is linear is because the effective current through each resistive path 25 or 27 is not dependent on the current through any of the other resistive path. Thus, ideally, the current through a resistive path 25 or 27 should not depend on the 1-bit digital input signal 12, x(k). This is true for the ideal cases of the three techniques described above and illustrated in FIGS. 5a–c. In practice, however, this may not be completely true.

If, in FIG. 5c, due to random manufacturing resistance mismatches, the "on" resistance of gate $T_A$ is not equivalent to the "on" resistance of gate $T_B$, then current $I_A$ passing through switch $T_A$ when shift register output tap $B_i$ is a logic 1 would not be equivalent to current $I_i$ through gate $T_B$ when output tap $B_i$ is a logic 0. This means current $I_i$ through a resistive path 25 or 27, rather than being constant, is dependent on the input signal 12, x(k). This concept also applies to the embodiments illustrated in FIGS. 5a and 5b. Since the FIR filter structure as a whole is built as a current divider, if the current in one resistive path 25 or 27 changes, the amount of current through all paths 25 and 27 must change in order for the total current to remain equal to reference current IREF. Thus, there is potential for harmonic distortion to result. One of the first assumptions is that the value of current summing nodes IOUT and IOUT* must be held at the same potential. In practice, this may not be possible due to random op amp offset voltages. Fortunately, to the extent the harmonic distortion is even-ordered, using differential non-inverted and inverted currents, IOUT and IOUT*, and converting them to differential voltages as shown in FIG. 4, will reduce the total harmonic distortion.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A current steering semi-digital reconstruction filter for a digital-to-analog conversion circuit, comprising:

(a) a shift register having a 1-bit digital input stream and a plurality of output taps, wherein each said output tap provides a 1-bit signal which has a value of a logic 1 or a logic 0;

(b) a plurality of resistive paths, wherein each said resistive path includes a resistive element which is connected to a common current source, and to a first terminal of an active high switch and a first terminal of an active low switch;

wherein a single output tap is used to control said active high switch and said active low switch for a single resistive path; and wherein a second terminal of each said active high switch of each of said plurality of resistive paths is connected to a non-inverted current path, and a second terminal of each said active low switch for each of said plurality of resistive paths is connected to an inverted current path.

2. The filter of claim 1, further comprising a differential current-to-voltage conversion circuit, comprising:

a first operational amplifier circuit having an input connected to said non-inverted current path and a first feedback resistor connected between said first op amp input and a first op amp output; and a second operational amplifier circuit having an input connected to said inverted current path and a second feedback resistor connected between said second op amp input and a second op amp output;

wherein the voltage output from said first and said second op amp outputs comprises a differential output voltage.

3. The filter of claim 2, further comprising a means for converting said differential output voltage to a single-ended voltage.

4. The filter of claim 3, wherein said means for converting comprises a third operational amplifier, having a negative and a positive input terminal;

wherein said negative input terminal is connected to a third feedback resistor and to a series input resistor;

wherein said positive input terminal is connected to a voltage divider resistor network; and wherein said series input resistor is also connected to said output of said first operational amplifier circuit and said voltage divider resistor network is also connected to said output of said second operational amplifier circuit.

5. The filter of claim 2, further comprising a first high frequency feedback capacitor connected in parallel with said first feedback resistor and a second high frequency feedback capacitor is connected in parallel with said second feedback resistor.

6. The filter of claim 1, further comprising a DC offset current source connected to said inverted current path and to said non-inverted current path.

7. The filter of claim 1, wherein said resistive element comprises a resistor.

8. The filter of claim 1, wherein said resistive element comprises a CMOS transmission gate.

9. The filter of claim 1, wherein said resistive element comprises a MOSFET.

10. A method of converting a 1-bit digital input signal to an analog output signal, comprising the steps of:

(a) inputting said 1-bit digital input signal to a shift register;

(b) shifting said 1-bit signal through said shift register;

(c) providing, as a control bit, said shifted 1-bit signal to a plurality of output taps disposed along said shift register, wherein said control bit has a value of either a logic 1 or a logic 0;

(d) controlling a plurality of non-inverted current switches and inverted current switches with said bit-values of said shift register output taps, wherein a single output tap value controls a single pair of switches comprised of a single non-inverted current switch and a single inverted current switch, and wherein said plurality of non-inverted current switches and inverted current switches are connected to a common current source;

(e) producing a differential current from said plurality of non-inverting current switches and inverting current switches; and (f) inputting said differential current to a first and a second op amp circuit, wherein a differential voltage is output from said first and second op amp circuits.

11. The method of claim 10, wherein said first and second op amp circuits each include a feedback resistor.

12. The method of claim 10, wherein said first and second op amp circuits each include a high frequency feedback capacitor.

13. The method of claim 10, further comprising the step of using a DC offset current source connected to said differential current to subtract a DC offset current value from said differential current.

14. The method of claim 10, further comprising the step of providing said differential voltage output from said first and second op amp circuits to a third op amp circuit which provides a single-ended output voltage.

15. The method of claim 14, wherein said third op amp circuit includes a series resistor connected to a first input of said third op amp circuit and a voltage divider resistor network connected to a second input of said third op amp circuit.

16. The method of claim 10, wherein each of said plurality of non-inverted current switches and inverted current switches are connected to said common current source through a resistive element.

17. The method of claim 16, wherein said resistive element comprises a resistor.

18. The method of claim 16, wherein said resistive element comprises a CMOS transmission gate.

19. The method of claim 16, wherein said resistive element comprises a MOSFET.

20. A method of converting a 1-bit digital input signal to an analog output signal, comprising the steps of:

(a) inputting said 1-bit digital input signal to a shift register;

(b) shifting said 1-bit signal through said shift register;

(c) providing, as a control bit, said shifted 1-bit signal to a plurality of output taps disposed along said shift register, wherein said control bit has a value of either a logic 1 or a logic 0;

(d) producing a differential current at a pair of current summing nodes by using said control bits to open or close switches disposed along a plurality of resistive paths connected to a common reference current source, wherein a DC offset current is subtracted from said differential current; and (e) inputting said differential current to a current-to-voltage conversion circuit, wherein a differential voltage is output from said current-to-voltage conversion circuit.

21. The method of claim 20, wherein said DC offset current is equal to one-half the value of said common reference current source.

* * * * *